United States Patent [19]
Takemura et al.

[11] Patent Number: 5,251,107
[45] Date of Patent: Oct. 5, 1993

[54] SEMICONDUCTOR PACKAGE

[75] Inventors: Seiji Takemura, Itami; Masataka Kawai, Kawanishi, both of Japan

[73] Assignee: Mitsubishi Denki Kabushiki Kaisha, Tokyo, Japan

[21] Appl. No.: 798,737

[22] Filed: Nov. 27, 1991

[30] Foreign Application Priority Data

Nov. 28, 1990 [JP] Japan .................................. 2-322288

[51] Int. Cl.$^5$ ............................................. H05K 7/02
[52] U.S. Cl. ................................. 361/783; 174/52.4; 361/764; 361/777
[58] Field of Search ............... 361/400, 401, 409, 417, 361/418, 421, 399, 380, 392, 415; 174/52.4, 261; 357/74, 65, 68, 70; 257/666, 697, 690, 661

[56] References Cited

U.S. PATENT DOCUMENTS 4,618,739 10/1986 Theobald .................. 174/52 FP
4,822,550 4/1989 Komathu .................. 264/263

Primary Examiner—Leo P. Picard
Assistant Examiner—Young S. Whang
Attorney, Agent, or Firm—Leydig, Voit & Mayer

[57] ABSTRACT

A quadrate semiconductor element in the form of a quad flat package, a bare chip, and the like mounted on a substrate has a plurality of first terminals electrically connected through connecting wires to corresponding second terminals which are disposed on the substrate around the semiconductor element. The second terminals are disposed on the substrate such that the number of second terminals per unit area is less at locations near the corners of the quadrate semiconductor element than at the other portions of the substrate. This arrangement enlarges the effective wiring area for the connecting wires at the corners, thus greatly improving wiring efficiency.

6 Claims, 3 Drawing Sheets

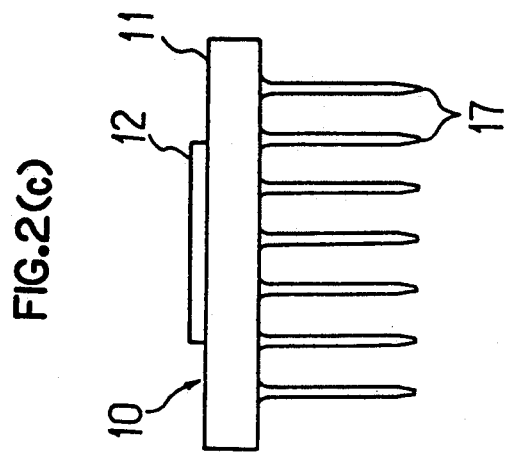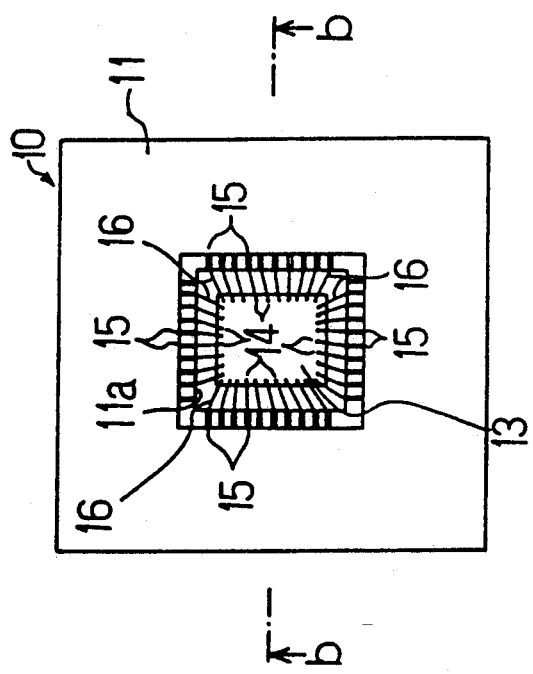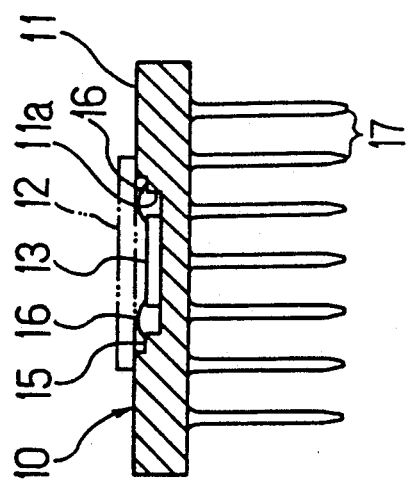

SEMICONDUCTOR PACKAGE

BACKGROUND OF THE INVENTION

The present invention relates to a semiconductor package, and more particularly, but not exclusively, to a pin-grid-array package (hereinafter abbreviated as a PGA package) including a substrate provided on one surface with a plurality of terminal or connector pins.

A typical conventional PGA semiconductor package is shown in FIGS. 3(a) and 3(b). The illustrated PGA package includes a semiconductor element 102 in the form of a quad flat package (hereinafter simply referred to as a QFP) or a packaged semiconductor chip of a quadrate or rectangular configuration mounted on a surface of a rectangular-shaped substrate 101, the QFP 102 having a multitude of terminals 103 outwardly extending from the outer peripheral side edges thereof. The terminals 103 are connected by soldering to corresponding conductive connector lands 104 which are formed on the substrate 101 in an aligned parallel relation with the four side edges thereof at locations spaced apart a predetermined distance. The connector lands 104 are electrically connected through fine connecting wires 105, such as gold wires, to corresponding external terminals 106 in the form of connector pins which are disposed around the QFP 102 and which vertically extend from the other surface of the substrate 101. The respective connector pins 106 have their basal ends inserted into and fixedly secured, such as by soldering to corresponding through-holes (not shown) which are perforated through the substrate 101 and disposed in a grid-like pattern.

With the above-described conventional PGA package, however, the number of connector pins 106 is relatively limited and the distance or pitch between adjacent pins 106 is relatively wide, so the number of connecting wires 105 passing between adjacent connector pins 106 particularly near the corners of the QFP 102 is relatively limited, thus giving rise to no problem or difficulty in wiring. However, as the number of the connector pins 106 increases, the following problems arise.

In the course of recent developments in semiconductor technology, the increased number of the connector pins 106 as well as the resultant reduced distance or pitch between adjacent pins 106 inevitably leads to an increase in wiring density of the connecting wires 105. As a result, the number of the connecting wires 105 disposed between adjacent pins 106 at locations near the corners of the QFP 102 is greatly increased (e.g., nearly doubled) as compared with the other portions thereof, thus making it extremely difficult to achieve proper wire arrangements particularly at locations near the corners of the QFP 102.

SUMMARY OF THE INVENTION

Accordingly, the present invention is aimed at solving the above-described problems encountered with the conventional semiconductor packages.

An object of the invention is to provide a novel and improved semiconductor package in which the number of terminals and hence the number of connecting wires per unit area disposed particularly at locations near corners of a quadrate semiconductor element can be reduced to enlarge effective wiring areas for the connecting wires near the corners, thus improving wiring efficiency to a substantial extent.

In order to achieve the above objects, according to the present invention, there is provided a semiconductor package comprising: a substrate; a semiconductor element of a configuration having corners and mounted on the substrate, the semiconductor element having a plurality of first terminals; and a plurality of second terminals provided on the substrate around the semiconductor element and electrically connected to the corresponding first terminals, the second terminals being disposed such that the number of second terminals per unit area is less at locations near the corners of the semiconductor element than at the other portions thereof.

In a preferred embodiment, the semiconductor element is a quad flat package, and the substrate has four connector land arrays each comprising a multitude of discrete connector lands disposed substantially in a line and in parallel with a corresponding peripheral side edge of the quad flat package. The connector lands are electrically connected to the corresponding first terminals of the quad flat package and the second terminals on the substrate. The second terminals comprise a plurality of rows of connector pins which are disposed in a grid pattern with each row extending along a corresponding one of the connector land arrays in such a manner that some of the second terminals located near the opposite ends of each connector land array are omitted.

In another preferred embodiment, the semiconductor element is a semiconductor chip, and the substrate is formed on one surface thereof with a quadrate chip-mounting recess in which the chip is received, and the second terminals are internal terminals which are formed around the recess except for locations near corners thereof. The chip in the recess and the internal terminals are sealed with a cover. The internal terminals are electrically connected to the first terminals of the chip through connecting wires as well as to external terminals which are formed on the substrate for external electrical connection.

The above and other objects, features and advantages of the invention will be more readily apparent from the following detailed description of a few preferred embodiments of the invention taken in conjunction with the accompanying drawings.

BRIEF DESCRIPTION OF THE DRAWINGS

FIG. 2(a) is a plan view of a semiconductor package in accordance with a second embodiment of the invention;

FIG. 2(b) is a cross sectional view taken along line b—b of FIG. 2(a);

FIG. 2(c) is a side elevational view of the semiconductor package of FIG. 2(a);

DESCRIPTION OF THE PREFERRED EMBODIMENTS

Preferred embodiments of the present invention will now be described in detail with reference to the accompanying drawings.

Figure 1A:
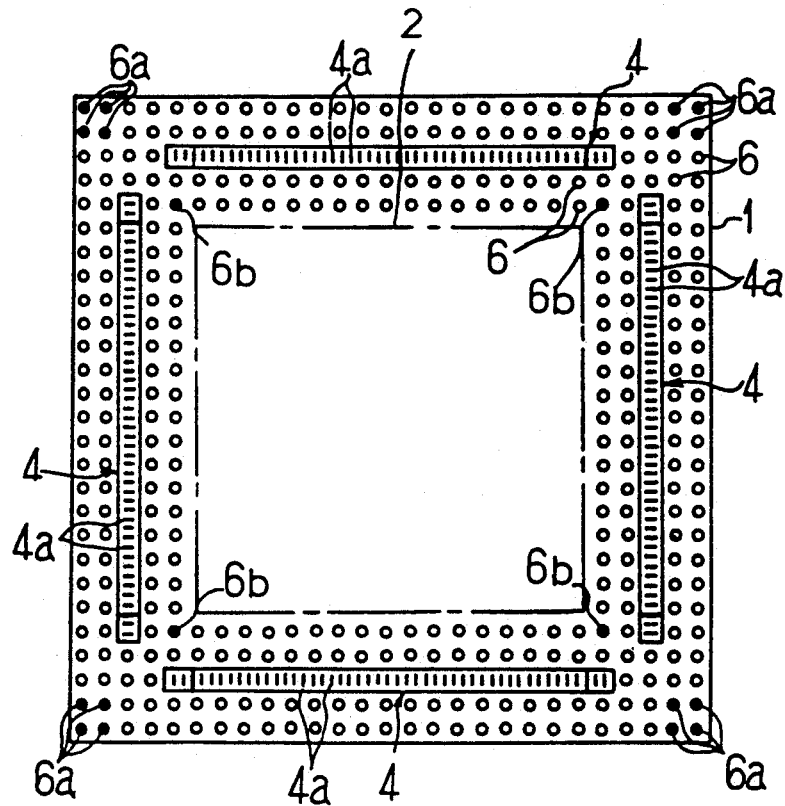
FIG. 1(a) is a plan view of a PGA semiconductor package with a semiconductor element or a packaged chip (QFP) removed in accordance with a first embodiment of the invention.
Figure 1B:
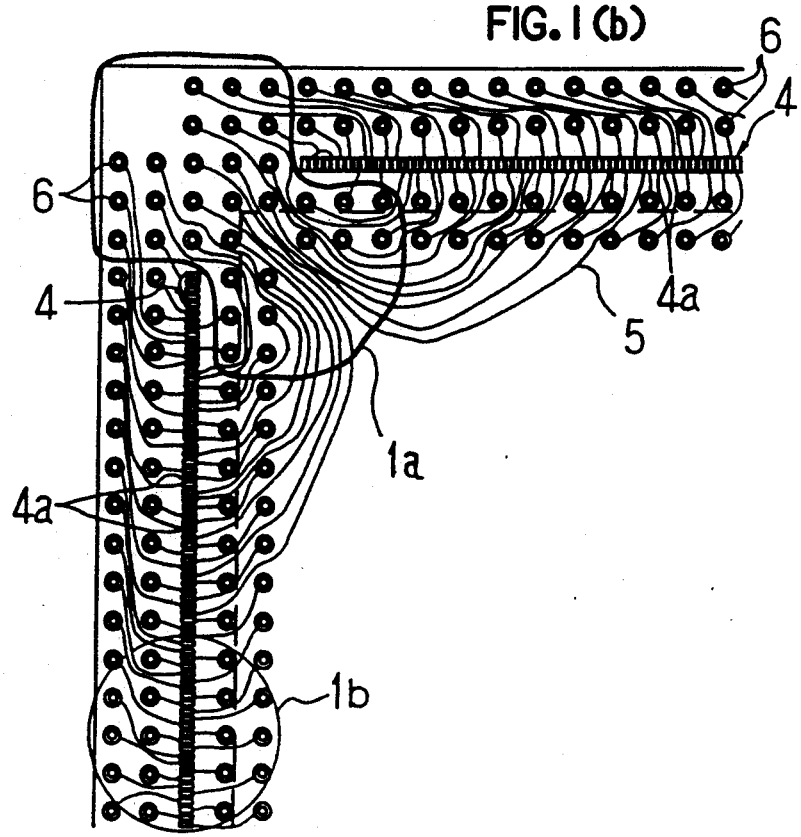
FIG. 1(b) is a partial, enlarged view of FIG. 1(a)
Figure 3A:
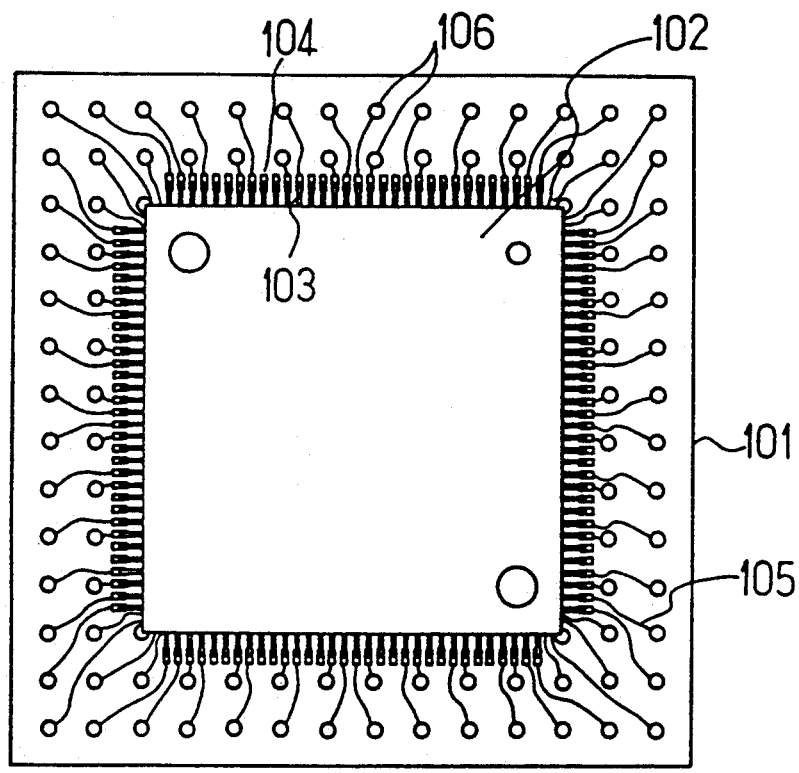
FIG. 3(a) is a plan view of a conventional semiconductor package.
Figure 3B:
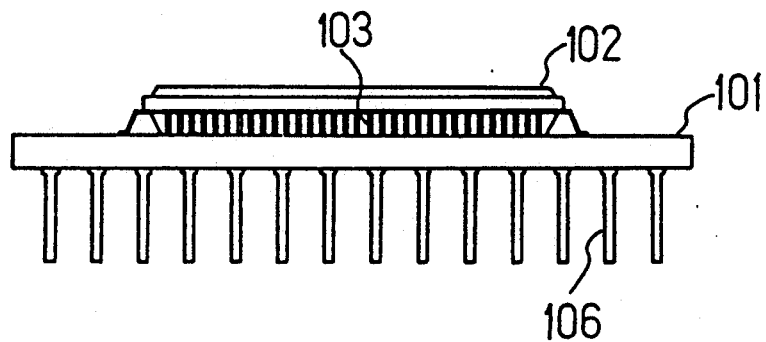
FIG. 3(b) is a side elevational view of the conventional semiconductor package of FIG. 3(a).

Referring to the drawings and first to FIGS. 1(a) and 1(b), there is shown a semiconductor package in the form of a PGA package constructed in accordance with the principles of the invention. In these figures, the basic construction of the semiconductor package is illustrated with a semiconductor element removed for the sake of simplification and clarity of explanation. The removed semiconductor element, designated by phantom line 2 in FIG. 1(a), is the same as element 102 of the aforementioned conventional semiconductor package illustrated in FIGS. 3(a) and 3(b), and actually it is to be mounted on one surface of a flat substrate 1. In this embodiment, the distance or pitch between adjacent external or second terminals 6 in the form of connector pins vertically extending from the other surface of the substrate 1 is substantially one half of that in the conventional semiconductor package of FIGS. 3(a) and 3(b), and the number of the connector pins 6 per unit area of this embodiment is much larger in the conventional package, so some difficulty generally arises in wiring at locations near the corners of the semiconductor element (QFP) 2 or the corners of the substrate 1. To cope with this situation, according to the present invention, some of connector pins 6 near the four corners of the QFP 2 (i.e., the four corners of the substrate 1) are omitted, as depicted by small solid circles 6a, 6b in FIG. 1(a). In other words, some (five for each corner in the illustrated embodiment of FIG. 1(a)) connector pins are removed for mitigating or reducing the wiring density or the number of connecting wires 5 (see FIG. 1(b)) near the corners. This results in an enlargement in the effective wiring areas there. In this manner, decreasing the number of connector pins 6 near the corners of the substrate 1 remarkably facilitates the efficiency in wiring at the corners, as shown by a closed solid line 1a in FIG. 1(b) on an enlarged scale, in spite of the fact that the total number of the connector pins 6 has greatly increased as compared with the conventional semiconductor package of FIG. 3(a) and 3(b).

More specifically, in this embodiment, as shown in FIG. 1(a), four connector land arrays 4 are provided on one surface of the substrate 1, each connector land array 4 comprising a multitude of small discrete connector lands 4a disposed in a line in the vicinity of and parallel to a corresponding side edge of the QFP 2 mounted on the surface of the substrate 1. Inside and near each connector land array 4, there are two rows of external terminals or connector pins 6 which are aligned at the same or equal interval or pitch between adjacent pins and parallel to a corresponding connector land array 4. In addition, disposed outside and near each connector land array 4, too, are two rows of external terminals or connector pins 6 which are aligned at the same or equal interval or pitch and parallel to a corresponding connector land array 4. Three additional connector pins 6 are aligned with each connector land array 4 at each end thereof with the endmost connector pins 6 being positioned at a corner point or intersection of lines extended from two adjacent connector land arrays 4. These connector pins 6 disposed along a line are disposed substantially at the same or equal interval or pitch. As clearly seen from FIG. 1(b), the respective connector lands 4a in each connector land array 4 are electrically connected to the corresponding connector pins 6 through respective connecting wires 5. As depicted by small solid circles in FIG. 1(a), among the two rows of connector pins 6 outside each connector land array 4, four connector pins 6 are omitted or not disposed at each corner. Similarly, one connector pin 6 at a corner point or intersection between two adjacent innermost rows of connector pins 6 is omitted. With such a disposition of the connector pins 6, as clearly shown on an enlarged scale in FIG. 1(b), it becomes possible to reduce the wiring density at the corners 1a of the substrate 1 to make it equal to that at the other (e.g., central) portions 1b of the respective rows as much as possible. Accordingly, connections between the respective connector lands 4a and the corresponding connector pins 6 through the fine connecting wires 5 can be performed without difficulty in quite an efficient manner.

In the above embodiment, the substrate 1 may be a laminated or multi-layered substrate comprising a plurality of circuit layers or a ceramic substrate comprising a single layer.

FIGS. 2(a) through 2(c) show a second embodiment of the invention. In this embodiment, instead of a QFP, a PGA semiconductor package, generally designated by reference numeral 10, has a semiconductor element 13 in the form of a bare semiconductor chip mounted on a substrate 11. Specifically, the semiconductor package 10 includes a substrate 11 in the form of a laminar or multi-layered substrate having a quadrate chip-mounting recess 11a formed in one surface thereof and a cover 12 closing the recess 11a in an air-tight manner. The substrate 11 has a multitude of second terminals 15 in the form of internal terminals provided around the peripheral portions of the quadrate recess 11a. The semiconductor chip 13, such as an IC chip of a quadrate or square configuration, which has a multitude of first terminals 14 in the form of electrodes formed on one surface of the semiconductor chip 13, is received in the recess 11a in the substrate 11 with the electrodes 14 on the chip 13 being connected to the corresponding internal terminals 15 around the recess 11a through fine connecting wires 16. The cover 12 is then attached and properly fixed to the surface of the substrate 11 to seal the semiconductor chip 13 along with its related elements in the recess 11a from the ambient atmosphere.

More specifically, the multi-layered substrate 11 is disposed on one surface thereof with the quadrate recess 11a with the internal terminals 15 around the periphery of the recess 11a, i.e., along four side edges thereof, and with a multitude of external terminals 17 on the other surface thereof in the form of connector pins perpendicularly extending therefrom. The internal terminals 15 are electrically connected to the corresponding connector pins 17 through unillustrated connector circuits formed in the multi-layered substrate 11. As shown in FIG. 2(a), there is no internal terminals near the corners of the quadrate recess 11a. As a consequence, when the electrodes 14 on the semiconductor chip 13 are connected to the internal terminals 15 on the multi-layered substrate 11 through the fine connecting wires 16, there is no fear that the wiring areas or spaces for arranging the connecting wires 16 will be reduced or narrowed particularly in the vicinity of the corners of the quadrate recess 11a. As a result, the wiring density of the connecting wires 16 near the corners is increased to expedite the wiring operation as to well as improve the wiring efficiency as a whole.

Although in the above-described second embodiment, the substrate 11 comprises a laminated or multi-layered substrate, it can be a single-layered ceramic substrate.

What is claimed is:

1. A semiconductor package mounting comprising:
   a substrate having a rectangular shape including four sides and four corners and four connector land arrays, each land array comprising a plurality of discrete electrically conductive connector lands disposed substantially along a straight line parallel to a corresponding side of said substrate;
   a semiconductor chip having a rectangular configuration including four sides and four corners, and a plurality of first terminals disposed along the four sides of said semiconductor chip, said semiconductor chip being mounted on said substrate with respective sides of said semiconductor chip aligned with corresponding sides of said substrate; and
   a plurality of second terminals disposed on said substrate surrounding said semiconductor chip wherein each of said connector lands is electrically connected to a respective first terminal and to a corresponding second terminal on said substrate, and the number of second terminals per unit area is smaller near the corners of said substrate than remote from the corners of said substrate.

2. The semiconductor package mounting according to claim 1 wherein said second terminals are disposed in a regular grid pattern on said substrate except near the corners of said substrate.

3. The semiconductor package mounting according to claim 1 wherein said second terminals are missing from the regular grid pattern near the corners of said substrate.

4. The semiconductor package mounting according to claim 1 wherein said second terminals are a plurality of rows of connector pins disposed in a regular grid pattern with each row extending along a corresponding connector land array, some positions of said grid pattern near opposite ends of each connector land array not including second terminals.

5. The semiconductor package mounting according to claim 1 wherein at least one row of said second terminals is disposed on the opposite side of one of said connector land arrays from said semiconductor chip.

6. The semiconductor package mounting according to claim 5 wherein at least one row of said second terminals is disposed between one of said connector land arrays and said semiconductor chip.

* * * * *